United States Patent [19]

Yang

[11] Patent Number: 5,656,556
[45] Date of Patent: Aug. 12, 1997

[54] METHOD FOR FABRICATING PLANARIZED BOROPHOSPHOSILICATE GLASS FILMS HAVING LOW ANNEAL TEMPERATURES

[75] Inventor: Fu-Liang Yang, Tainan, Taiwan

[73] Assignee: Vanguard International Semiconductor, Hsin-chu, Taiwan

[21] Appl. No.: 684,663

[22] Filed: Jul. 22, 1996

[51] Int. Cl.$^6$ ................................. H01L 21/316
[52] U.S. Cl. .................. 438/646; 438/760; 438/626; 438/698
[58] Field of Search ................. 437/240, 982, 437/236, 238, 228, 195, 235

[56] References Cited

U.S. PATENT DOCUMENTS

| | | | |
|---|---|---|---|
| 5,004,704 | 4/1991 | Maeda et al. | 437/240 |
| 5,077,238 | 12/1991 | Fujii et al. | 437/982 |
| 5,268,333 | 12/1993 | Lee et al. | 437/236 |
| 5,296,094 | 3/1994 | Shan et al. | 156/651 |
| 5,376,591 | 12/1994 | Maeda et al. | 437/240 |

FOREIGN PATENT DOCUMENTS

| | | | |
|---|---|---|---|
| 0192239 | 8/1988 | Japan | 437/240 |
| 0076727 | 3/1989 | Japan | 437/982 |

*Primary Examiner*—Charles L. Bowers, Jr.
*Assistant Examiner*—Matthew Whipple
*Attorney, Agent, or Firm*—George O. Saile

[57] ABSTRACT

An improved method for forming a planar borophosphosilicate glass (BPSG) insulating layer having a reduced thermal budget was achieved. The method involves forming a multilayer BPSG comprised of four layers with different boron and phosphorus concentrations in each layer. The first layer deposited has the conventional doping range, and therefore would require higher reflow temperatures for leveling. By the method of this invention, a second low-doped BPSG buffer layer is deposited and then a heavily doped third BPSG layer is deposited having a lower reflow temperature, and therefore is planarized at a lower temperature. A low-doped fourth cap BPSG layer is used over the third BPSG layer to minimize moisture absorption and unstable crystal formation prior to the reflow anneal.

31 Claims, 3 Drawing Sheets

METHOD FOR FABRICATING PLANARIZED BOROPHOSPHOSILICATE GLASS FILMS HAVING LOW ANNEAL TEMPERATURES

BACKGROUND OF THE INVENTION

(1) Field of the Invention

The present invention relates to a method for forming planarized insulating layers on semiconductor integrated circuits and more particularly, a method for leveling a multilayer borophosphosilicate glass (BPSG) at lower temperatures over patterned conducting layers on semiconductor substrates.

(2) Description of the Prior Art

Advances in semiconductor processing have reduced the minimum feature sizes on semiconductor integrated circuits to well below a half micrometer resulting in today's Ultra Large Scale Integration (ULSI) of circuits on semiconductor substrates. For example, improvements in high resolution photolithographic techniques have lead to submicrometer resolution in photoresist image sizes. The replacement of wet etching by directional (anisotropic) plasma etching allows the photoresist image to be replicated in the underlying multilayers of insulating and conducting layers that make up in part the semiconductor devices on the substrate. The accumulated effect of depositing these layers and the subsequent patterning of these layers, one layer on top of the other, result in substantially irregular or non-planar surface features on an otherwise microscopically planar substrate surface. The roughness of the topography worsens as the number of patterned layers increases on more advanced ULSI circuits, where the widths and spacing between patterned layers decrease. This rough topography is substantially worse at the later processing steps when the multilayer metallurgy is used to wire up the discrete devices on the integrated circuit chip.

These advancements in high resolution photolithography and anisotropic plasma etching have not come without certain technological problems. For example, the improvements in photolithographic resolution require large numerical aperture (NA) for the lens during optical exposure. This results in a more shallow depth of focus (DOF), and therefore causes unwanted distorted photoresist images over non-planar portions of the substrates. Further, anisotropic etching to pattern the various conducting layers over the non-planar surface can result in residue on the sidewalls of the underlying patterns, which can lead to intra-level shorts for conducting layers. In addition, thinning of narrow interconnecting metal lines over steps in underlying patterned layers can result in low yield and early failure of the circuit. This is especially true at high current densities where electromigration of the metal atoms in the line can lead to voids and open lines, or can result in extrusion of metal between the closely spaced lines leading to shorts. Another concern is the very shallow junctions that are required on ULSI Circuits to improve performance. This requires overall lower thermal budget (reduced temperatures and or anneal times) during processing to maintain the shallow junctions while also providing a planar insulating layer.

One method of forming a more planar dielectric layer involves depositing a relatively low-melting-temperature glass such as borophosphosilicate (BPSG), which is then annealed to level the layer. The degree of leveling can be improved by using higher temperature anneals for longer times and by increasing the dopant concentration of boron and phosphorus in the BPSG insulating layer, and/or increasing the thicknesses of the BPSG layer. However, as device feature sizes decrease for ULSI circuits, and more specifically the diffused junctions become shallower, it is essential to reduce the high temperature anneals and/or annealing times to reduce the overall thermal budget for processing the wafers. On the other hand, increasing the phosphorus and boron concentrations to lower the glass transition temperature (melting point) result in crystalline instabilities. Therefore, the upper limit of boron concentration is imposed by film stability. For example, BPSG with a concentration over 6 weight percentage (wt %) boron tends to be very hygroscopic and unstable, and therefore should be flowed immediately following deposition. At high dopant concentrations BPSG can also be an undesirable phosphorus diffusion source to the underlying silicon. This is particularly true at the higher boron concentration. Increasing the thickness of the BPSG layer increases the process times and adds to the manufacturing cost. An alternate method of planarizing the layer is to deposit an additional planarizing layer, such as-photoresist, and etching back, which is also more costly.

One method of reflowing the BPSG layer at lower temperatures is described in the prior art by Lee et al., U.S. Pat. No. 5,268,333. In this method, a first BPSG layer of lower concentration is formed over the resultant surface to a thickness of 6000 to 9000 Angstroms containing 3–4 wt % boron and 5–7 wt % phosphorus. A second BPSG layer of higher concentration is deposited over the resultant surface of the first BPSG layer having a thickness of 2000 to 6000 Angstroms and containing 4–7 wt % boron and 8–10 wt % phosphorus. This permits Lee et al. to lower the annealing temperature during reflow by as much as 50° C. However there is still a concern with the instability of the highly doped BPSG.

Therefore, there is still a strong need in the semiconductor industry to further improve on the planarization process using a lower reflow temperature of BPSG with higher boron and phosphorus concentrations, while avoiding the crystalline instability at the higher dopant concentrations.

SUMMARY OF THE INVENTION

It is a principal object of this invention to provide a method for forming an improved planarized insulating layer on a substrate having irregular surface topography.

It is another object of this invention to provide this planarized insulating layer by annealing a multilayer of BPSG at a lower temperature to reduce the thermal budget while avoiding hygroscopic effects and other crystalline instabilities.

In accordance with the present invention, a method is described for forming a planarized insulating layer using a multilayer of borophosphosilicate glass (BPSG) that is reflowed at lower anneal temperatures than the more conventional methods. The method starts by first providing a semiconductor substrate which typically has devices, such as field effect transistors (FETs) or bipolar transistors formed therein. A first insulating layer is deposited on the substrate having contact openings for making electrical contacts to the desired devices. A conducting layer is deposited over the first insulating layer for making electrical interconnecting lines to the integrated circuit devices. The conducting layer is typically composed of a conductively doped polysilicon or polycide (polysilicon/silicide). The conducting layer is then patterned using conventional photolithographic and anisotropic plasma etching techniques to form electrical interconnecting lines. A conformal second insulating layer is deposited over the patterned conducting layer and elsewhere on the substrate. The second insulating layer is preferably deposited by low pressure chemical vapor deposition (LPCVD) of undoped silicon oxide ($SiO_2$), and providing electrical insulation between the devices on and in the substrate and the next level of interconnections. It also serves as a barrier to out-diffusion of the dopant from a planarizing multilayer of borophosphosilicate glass (BPSG) that is formed next. The BPSG multilayer is formed by sequentially depositing a first BPSG layer having a boron concentration of about 4–6 weight percentage (wt %) and a phosphorus concentration of about 2–5 wt %, depositing a relatively thin, low doped second BPSG layer having a boron concentration of about 3–4 wt % and a phosphorus concentration of about 2–4 wt %, depositing a relatively thick, heavily doped third BPSG having a boron concentration of about 5–7 wt % and a phosphorus concentration of about 4–12 wt %, and finally depositing a relatively thin, low doped fourth BPSG layer having a boron concentration of about 3–4 wt % and a phosphorus concentration of about 2–4 wt %. The BPSG multilayer is now reflowed by thermal annealing to form a more planar insulating layer. The second BPSG layer serves as a buffer between the first and third BPSG layers to prevent the out-diffusion of dopants from the heavily doped third BPSG layer. The fourth BPSG layer, which is lightly doped, serves as a cap (barrier) layer to reduce the moisture absorbed in the heavily doped third BPSG layer when exposed to the ambient. Since the low doped BPSG cap layer inhibits moisture absorption, the BPSG layer does not require the immediate annealing that would be required in the more conventional process, and provides a more reliable manufacturing process. The high boron and phosphorus dopant concentrations in the third BPSG layer, in the absence of a cap oxide, can result in unwanted $BPO_4$ crystals being formed in and on the BPSG surface that can result in micro-masking and a rough surface during the subsequent etch-back. The low doped BPSG cap layer eliminates this concern. Since the third BPSG layer has a lower glass-flow temperature because it is heavily doped, it allows for more effective planarization during the annealing, thereby reducing the overall thermal budget for the ULSI process or providing a more planar layer for the same thermal budget. The BPSG multilayer is now plasma etched back into the first BPSG layer, leaving essentially intact the remaining first BPSG layer to provide a very planar insulating surface over closely spaced conducting lines, while providing a more gradual slope over the more widely spaced lines. Depositing a third undoped CVD silicon oxide over the planarized BPSG insulating layer completes the first level of interlevel dielectric layer (ILD) and prepares the ULSI circuit for the next level of integration.

BRIEF DESCRIPTION OF THE DRAWINGS

The object and other advantages of this invention are best explained in the preferred embodiment with reference to the attached drawings that include.

DESCRIPTION OF THE PREFERRED EMBODIMENTS

The method of this invention is now described in detail for fabricating a planarized insulating layer over a patterned conducting layer. The method utilizes a multilayer of borophosphosilicate glass (BPSG), one of the layers of the multilayer having a high dopant concentration which allows the annealing to be performed at a lower temperature. This is advantageous for building ULSI circuits requiring a lower thermal budget. The method further utilizes a low-doped BPSG cap layer which minimizes the moisture absorption and unstable crystal formation in the higher doped BPSG. The latter effect can result in micromasking during the etch-back of the high-doped BPSG to form an unwanted rough surface during the formation of the planar insulating layer.

Figure 1:
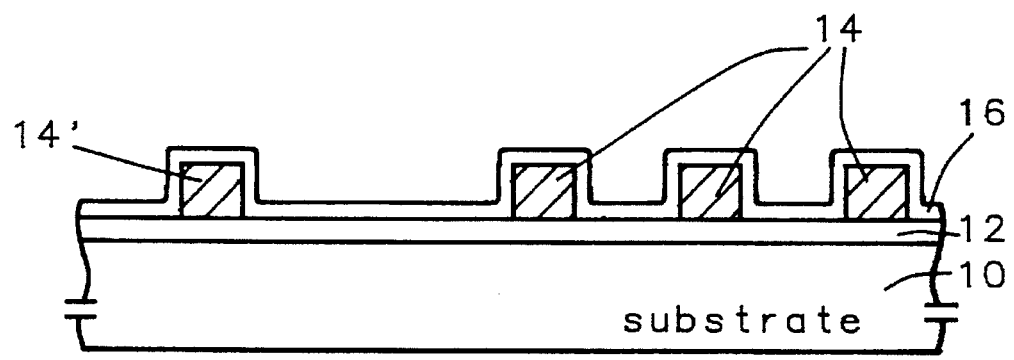
FIGS. 1 through 5 are schematic cross-sectional views showing the process for fabricating the planarized borophosphosilicate glass (BPSG) insulating layer over a patterned conducting layer by the method of this invention.

Referring now to FIG. 1, the method begins by providing a semiconductor substrate 10 typically having semiconductor devices, such as field effect transistors (FETs) or bipolar transistors. To simplify the discussion, these semiconductor devices are not depicted in FIG. 1. Typically the substrate most commonly used is composed of a single crystal silicon having, for example, a <100> crystallographic orientation. However, the invention is applicable to other types of substrates having patterned conducting layers. A first insulating layer 12 is formed over the substrate 10 which provides electrical insulation of the devices on the substrate from the next level of electrical interconnections. Preferably the insulating layer 12 is formed by low pressure chemical vapor deposition (LPCVD) using, for example, a reactant gas such as tetraethosiloxane (TEOS) at a temperature typically between about 650° and 800° C. Preferably the insulating layer 12 is deposited to a thickness of between about 500 and 3000 Angstroms. Although the insulating layer 12 has contact openings to device areas, these are not relevant to the invention, and therefore are not depicted in FIG. 1.

Still referring to FIG. 1, a conducting layer 14 is deposited on the first insulating layer 12 and patterned to form the electrical interconnecting lines or capacitors for memory devices for the integrated circuit devices. preferably the conducting layer 14 is a polysilicon layer which is heavily doped to make it electrically conducting. For example, layer 14 is preferably conductively doped with $N^+$ or $P^+$ type dopants. For example, the $N^+$ type dopant for layer 14 can be arsenic (As) or phosphorus (P), and the $P^+$ type dopant can be boron (B). The polysilicon layer 14 is typically doped by ion implantation, or alternatively by in-situ doping. Alternatively, to improve the electrical conductivity and device performance, layer 14 can also be formed from a polycide layer (doped polysilicon and refractory metal silicide). For example, the silicide can be a tungsten silicide ($WSi_2$) and deposited, for example, by low pressure CVD using a reactant gas such as tungsten hexafluoride ($WF_6$). Layer 14 is then patterned using conventional photolithographic techniques and anisotropic plasma etching to form the electrical inter-connecting lines. For example, the etching can be carried out in a reactive ion etcher (RIE) using a gas mixture containing chlorine ($Cl_2$) and a carrier gas, such as argon (Ar). Shown in FIG. 1 is a cross section through a portion of the substrate 10 after patterning the conducting layer 14 having a series of closely spaced interconnecting lines also labeled 14, and a single conducting line labeled 14' having a wider spacing.

Referring still to FIG. 1, a conformal second insulating layer 16 is now deposited over the patterned conducting layer 14 and elsewhere on the substrate 10. This layer is preferably silicon oxide ($SiO_2$) and provides a barrier to prevent out-diffusions of dopants from the borophosphosilicate glass (BPSG) that is deposited later. One preferred method for depositing layer 16 is by LPCVD. For example, the deposition can be carried out in a reactor using a reactant gas, such as TEOS. The preferred thickness of layer 16 is between about 500 and 3000 Angstroms.

Figure 2:
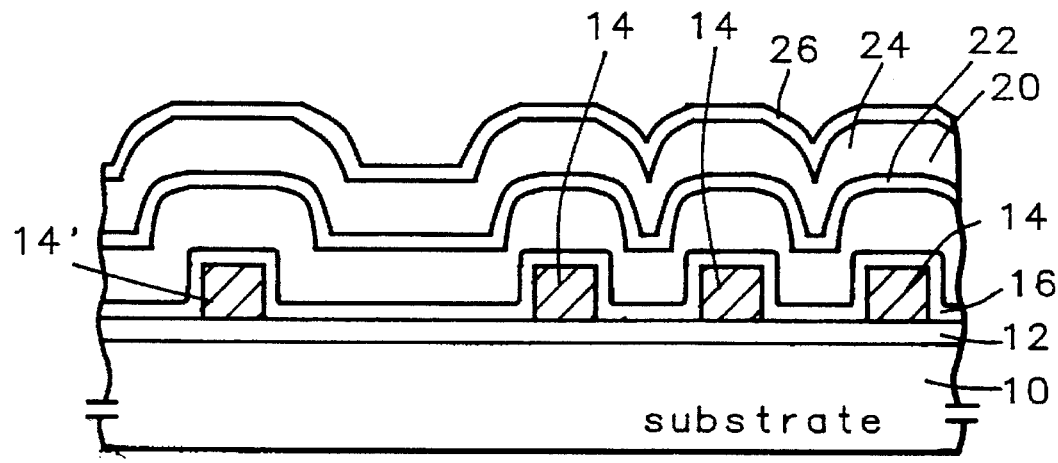

Referring now to FIG. 2, and more specifically to the method of this invention, a multilayer of borophosphosilicate glass (BPSG) is deposited over the insulating layer 16. The multilayer is composed of four BPSG layers 20, 22, 24, and 26, having different phosphorus and boron dopant concentrations, deposited sequentially in the same or different deposition reactor. Preferably the layers are deposited in an atmospheric pressure chemical vapor deposition (APCVD) reactor using, for example, silane ($SiH_4$) and oxygen ($O_2$) or ozone ($O_3$) and is doped by adding to the reactant gas a dopant gas such as phosphine ($PH_3$) and boroethane ($B_2H_6$). The deposition temperature is typically between about 300° and 600° C. Alternatively, a doped BPTEOS oxide can be formed by using a TEOS reactant gas and dopant gases, such as trimethyl borate (TMP) and trimethyl phosphate (TMP). Further, the multilayer of BPSG can also be deposited using low pressure chemical vapor deposition (LPCVD) or sub-atmospheric (SA) pressure chemical vapor deposition (CVD).

The multilayer is composed of a first BPSG layer 20 having a boron concentration of between about 4 and 6 weight percentage (wt %) and a phosphorus concentration of between about 2 and 5 wt %. Preferably the BPSG layer 20 is deposited to a thickness of between about 5000 and 8000 Angstroms. A relatively thin second BPSG layer 22 is deposited having a boron concentration of between about 3 and 4 wt % and a phosphorus concentration of between about 2 and 4 wt %. Preferably layer 22 is between about 200 and 800 Angstroms thick. A relatively thick third BPSG layer 24 is now deposited on layer 22 having a boron concentration of between about 5 and 7 wt % and a phosphorus concentration of between about 4 and 12 wt %, and is deposited to a thickness of between about 2000 and 5000 Angstroms. Finally, a relatively thin fourth BPSG layer 26 is deposited having a relatively low boron concentration of between about 3 and 4 wt % and a phosphorus concentration of between about 2 and 4 wt %, and is deposited to between about 200 and 800 Angstroms thick.

Figure 3:
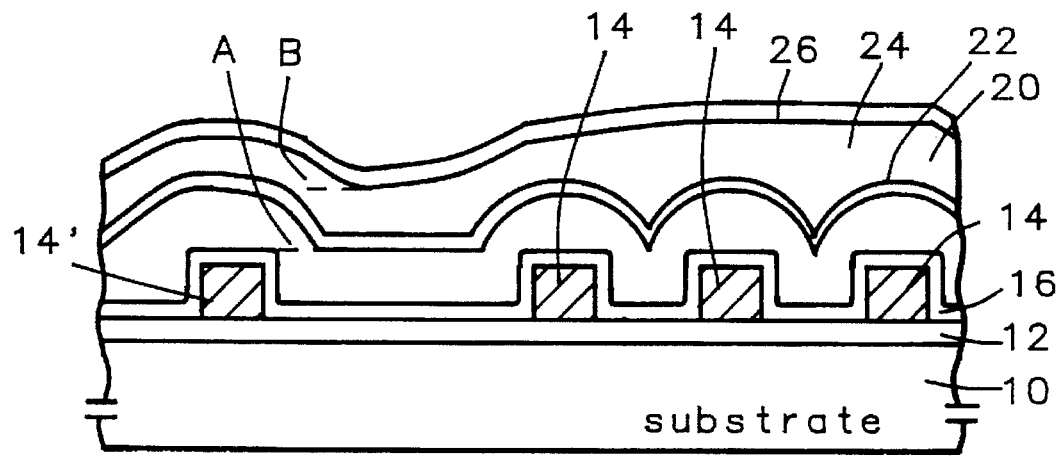
Figure 6:
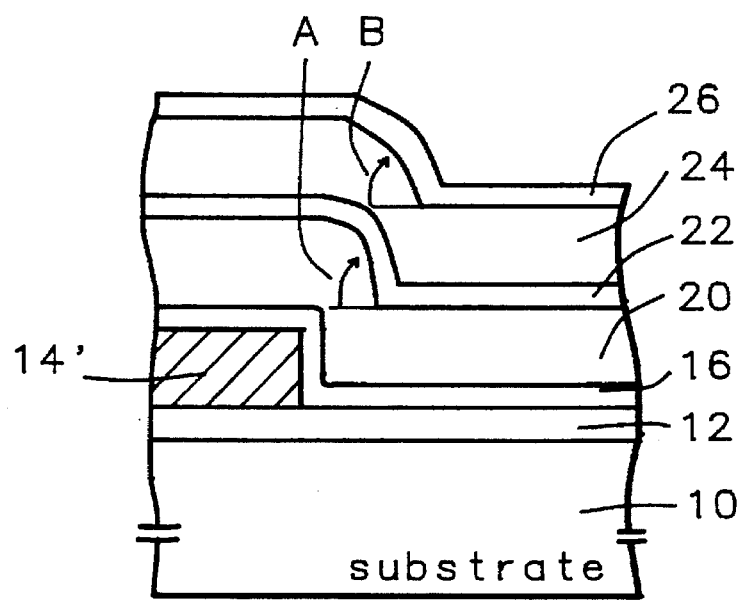
FIGS. 6 and 7 show enlarged schematic cross-sectional views for the profile of the planarized BPSG layer over the edge of the widely spaced, single conducting line, before and after the reflow anneal.
Figure 7:
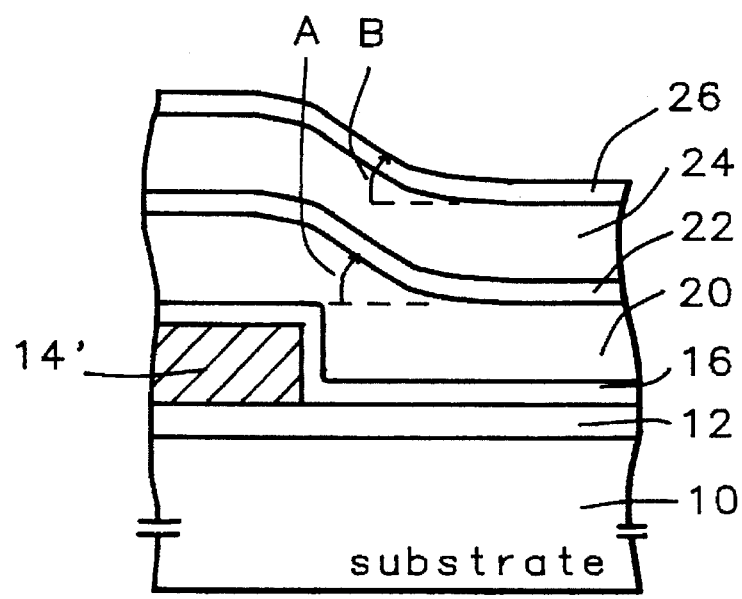

The BPSG multilayer is reflowed by annealing in an hydrogen (H2), oxygen ($O_2$), nitrogen ($N_2$), or steam ambient in the temperature range of between about 800° and 850° C. for a time of about 30 to 90 minutes. This results in a more planar BPSG insulating layer composed of layers 20, 22, 24, and 26, as shown in FIG. 3. To better understand the leveling process, by the method of this invention, an enlarged cross-sectional view is shown in FIGS. 6 and 7 for the profile of the isolated conducting line 14' in FIGS. 2 and 3 before and after the annealing step, respectively. As shown in FIG. 6 prior to annealing, the first BPSG layer 20 and the third BPSG layer 24 are conformal and have the same value for angles A and B, (A=B) as measured relative to the horizontal surface (substrate surface). However, after reflow, the more highly doped third BPSG layer 24 having the lower flow temperature (glass transition temperature) has a much shallower flow angle B than the flow angle A for the first BPSG layer 20, as shown in FIG. 7. This results in a much improved leveling of the BPSG multilayer, as is also depicted in FIG. 3. Also, as shown in FIG. 3, the BPSG multilayer layer (layers 20, 22, 24, and 26) is significantly more planar over the closely spaced conducting lines 14 than would otherwise be for a more conventional single BPSG layer, such as layer 20 in FIG. 3. Alternatively, the annealing temperature cited above can be reduced by about 25° to 75° C. to achieve the same degree of planarization as the more conventional prior-art single-layer BPSG process, thereby reducing the thermal budget for the process. This is very desirable for ULSI circuits where reducing the thermal budget for the overall process is important so as to minimize the diffusion of the shallow P/N junctions of the semiconductor devices in the silicon substrate.

The second BPSG layer 22 serves as a buffer between the first and third BPSG layers 20 and 24 to prevent the out-diffusion of dopants from the heavily doped third BPSG layer 24 into layer 20. As will be seen later, this is important when an etch-back step is performed to remove the heavily doped BPSG layer 24 which, if otherwise left on the substrate, would be hygroscopic and result in an unstable crystal structure: For example, high boron and phosphorus dopant concentrations and the presence of moisture in the third BPSG layer 24, in the absence of a cap oxide 26, can result in $BPO_4$ crystals being formed in and on the BPSG surface 24 which results in micro-masking. This produces an unwanted rough surface when the high doped BPSG layer 24 is removed by plasma etching during the subsequent etch-back step. The low-doped BPSG cap layer 26, by the method of this invention, allows the use of the high-doped BPSG (layer 24) while eliminating the moisture and unstable crystal concern. The fourth BPSG layer 26, being lightly doped (3–4 wt % boron and 2–4 wt % phosphorus) serves as a cap or barrier layer to minimize the amount of moisture being absorbed in the third BPSG layer between the time the BPSG multilayer is deposited and the time that the BPSG layer is annealed, thereby providing a more stable BPSG layer. Therefore, immediate annealing after depositing a high-doped BPSG, as is practiced in conventional processing is not required, and a more reliable manufacturing process is achieved.

Figure 4:
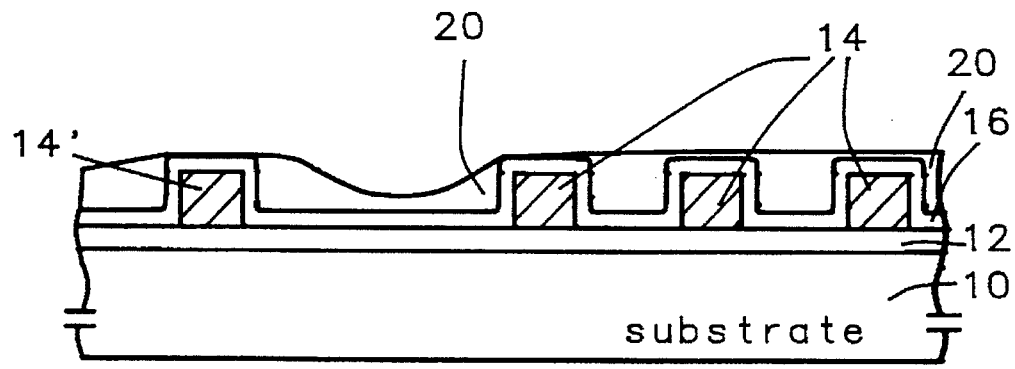

Referring now to FIG. 4 and continuing with the process, the BPSG multilayer is etched back into the first BPSG layer 20, removing completely the buffer BPSG layer 22 and the heavily doped BPSG layer 24. The remaining portions of the lower-doped BPSG layer 20 provide a very planar insulating surface over the closely spaced conducting lines 14, while the BPSG multilayer, after etch-back, provides a more gradual slope over the more widely spaced lines, as shown for line 14' in FIG. 4. Preferably the etch-back is carried out in a plasma etcher using, for example, an etchant gas such as carbon tetrafluoride ($CF_4$), trifluoromethane ($CHF_3$), carbon hexafluoride ($C_2F_6$) or like etchant gases.

Figure 5:
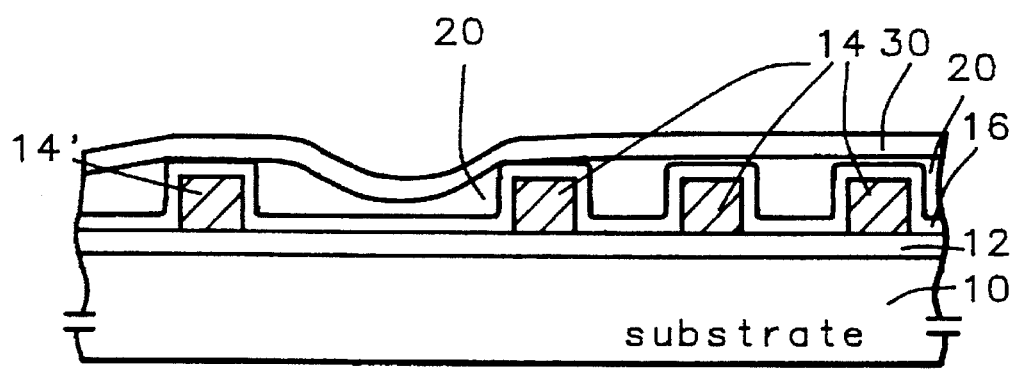

Referring now to FIG. 5, a third insulating layer 30 is deposited over the remaining BPSG layer 20. Layer 30 is preferably composed of silicon oxide ($SiO_2$) and is deposited, for example, by LPCVD using a reactant gas such as TEOS. Layer 30 is undoped and has a preferred thickness of between about 500 and 3000 Angstroms. This completes the process for forming a first interlevel dielectric (ILD) layer having a low thermal budget, and prepares the substrate for the next level of integration.

While the invention has been particularly shown and described with reference to the preferred embodiments thereof, it will be understood by those skilled in the art that various changes in form and details may be made without departing from the spirit and scope of the invention.

What is claimed is:

1. A method for forming a planar insulating layer over a patterned layer on a substrate comprising the steps of:

depositing a first insulating layer on a semiconductor substrate;

depositing a conducting layer over said first insulating layer;

patterning said conducting layer and forming interconnecting lines;

depositing a conformal second insulating layer over said patterned conducting layer;

depositing a first borophosphosilicate glass (BPSG) layer on said second insulating layer having a first boron concentration and a first phosphorus concentration;

depositing a second borophosphosilicate glass (BPSG) layer on said first borophosphosilicate glass having a second boron concentration and a second phosphorus concentration;

depositing a third borophosphosilicate glass (BPSG) layer on said second borophosphosilicate glass having a third boron concentration and a third phosphorus concentration;

depositing a fourth borophosphosilicate glass (BPSG) layer on said third borophosphosilicate glass having a fourth boron concentration and a fourth phosphorus concentration;

wherein said third boron and said third phosphorus concentrations are higher than the other boron concentrations and phosphorus concentrations, respectively;

reflowing by annealing said first, second, third, and fourth borophosphosilicate glass (BPSG) layers and leveling said BPSG layers;

etching back said BPSG layers and thereby completing said planar insulating layer over said patterned conducting layer on said substrate.

2. The method of claim 1, wherein said conducting layer is deposited having a thickness of between about 1000 and 8000 Angstroms.

3. The method of claim 1, wherein said conducting layer is a conductively doped polysilicon layer.

4. The method of claim 1, wherein said conducting layer is composed of a doped polysilicon layer having a refractory metal silicide on the surface.

5. The method of claim 1, wherein said first insulating layer is composed of silicon oxide having a thickness of between about 500 and 3000 Angstroms.

6. The method of claim 1, wherein said first, second, third, and fourth borophosphosilicate glass are deposited using consecutive low pressure chemical vapor depositions (LPCVD) in a reactor.

7. The method of claim 1, wherein said first borophosphosilicate glass has a thickness of between about 5000 and 8000 Angstroms.

8. The method of claim 1, wherein said second borophosphosilicate glass has a thickness of between about 200 and 800 Angstroms.

9. The method of claim 1, wherein said third borophosphosilicate glass has a thickness of between about 2000 and 5000 Angstroms.

10. The method of claim 1, wherein said fourth borophosphosilicate glass has a thickness of between about 200 and 800 Angstroms.

11. The method of claim 1, wherein said first boron concentration is about 4–6%, the first phosphorus concentration is about 2–5%, the second boron concentration is about 3–5%, the second phosphorus concentration is about 2–5%, the third boron concentration is about 5–7%, the third phosphorus concentration is about 4–12%, the fourth boron concentration is about 3–5%, and the fourth phosphorus concentration is about 2–5%.

12. The method of claim 1, wherein said first boron concentration is about 4–6%, said first phosphorus concentration is about 2–5%, said second boron concentration is about 3–5%, and said second phosphorus concentration is about 2–5%.

13. The method of claim 1, wherein said third boron concentration is about 5–7%, said third phosphorus concentration is about 4–12%, said fourth boron concentration is about 3–5%, and said fourth phosphorus concentration is about 2–5%.

14. The method of claim 1, wherein said second boron and said second phosphorus concentrations are essentially the same as said fourth boron and said fourth phosphorus concentrations, respectively and said third boron and said third phosphorus concentrations are higher than said first boron and said first phosphorus concentrations respectively.

15. The method of claim 1, wherein said first boron concentration is higher than said second boron concentration.

16. The method of claim 1, wherein said first boron and said third phosphorus concentrations are higher than said fourth boron concentration and said first phosphorus concentration respectively.

17. The method of claim 1, wherein said reflowing is carried out in a hydrogen ambient at a temperature between about 800° and 850° C. for about 30 to 90 minutes.

18. The method of claim 1, wherein said fourth BPSG layer having a boron concentration of less than 5 wt % minimizes the absorption of moisture forming a more stable BPSG layer during said reflow anneal.

19. The method of claim 1, wherein said second BPSG layer acts as a buffer layer allowing said third BPSG layer to be more highly doped, and protects said first BPSG layer from absorption of moisture.

20. A method for forming a planar insulating layer on a patterned conducting layer for integrated circuits on a semiconductor substrate comprising the steps of:

providing a semiconductor substrate having integrated circuit devices;

depositing a first insulating layer on said semiconductor substrate;

depositing a conducting layer over said first insulating layer for making electrical interconnecting metal lines to said integrated circuit devices;

patterning said conducting layer and forming said electrical interconnecting lines and capacitors for memory devices;

depositing a conformal second insulating layer over said patterned conducting layer;

depositing a first borophosphosilicate glass (BPSG) layer on said second insulating layer having a boron concentration of about 4 to 6 weight percentage (wt %) and a phosphorus concentration of about 2 to 5 wt %;

depositing a second borophosphosilicate glass (BPSG) layer on said first borophosphosilicate glass having a boron concentration of about 3 to 4 wt % and a phosphorus concentration of about 2 to 4 wt %;

depositing a third borophosphosilicate glass (BPSG) layer on said second borophosphosilicate glass having a boron concentration of about 5 to 7 wt % and a phosphorus concentration of about 4 to 12 wt %;

depositing a fourth borophosphosilicate glass (BPSG) layer on said third borophosphosilicate glass having a boron concentration of about 3 to 4 wt % and a phosphorus concentration of about 2 to 4 wt %;

reflowing by annealing said first, second, third, and fourth borophosphosilicate glass (BPSG) and leveling said BPSG layers;

etching back said fourth and third BPSG layers;

depositing a third insulating layer and thereby completing said planar insulating layer over said patterned conducting layer on said substrate.

21. The method of claim 20, wherein said conducting layer is deposited having a thickness of between about 1000 and 8000 Angstroms.

22. The method of claim 20, wherein said first insulating layer is composed of silicon oxide having a thickness of between about 500 and 3000 Angstroms.

23. The method of claim 20, wherein said first, second, third, and fourth borophosphosilicate glass layers are deposited using consecutive low pressure chemical vapor depositions (LPCVD) in a reactor.

24. The method of claim 20, wherein said first borophosphosilicate glass has a thickness of between about 5000 and 8000 Angstroms.

25. The method of claim 20, wherein said second borophosphosilicate glass has a thickness of between about 200 and 800 Angstroms.

26. The method of claim 20, wherein said third borophosphosilicate glass has a thickness of between about 2000 and 5000 Angstroms.

27. The method of claim 20, wherein said fourth borophosphosilicate glass has a thickness of between about 200 and 800 Angstroms.

28. The method of claim 20, wherein said reflowing is carried out in a hydrogen ambient at a temperature between about 800° and 850° C. for about 30 to 90 minutes.

29. The method of claim 20 wherein said reflowing is carried out in an oxygen ambient at a temperature between about 800° and 850° C. for about 30 to 90 minutes.

30. The method of claim 20, wherein said fourth BPSG layer having a boron concentration of less than 5 wt % minimizes the absorption of moisture forming a more stable BPSG layer during said reflow anneal.

31. The method of claim 20, wherein said second BPSG layer acts as a buffer layer allowing said third BPSG layer to be more highly doped, and protects said first BPSG layer from absorption of moisture.

* * * * *